United States Patent [19]

Robertson

[11] Patent Number: 4,952,836
[45] Date of Patent: Aug. 28, 1990

[54] PIEZOELECTROSTATIC GENERATOR

[75] Inventor: Glen A. Robertson, Harvest, Ala.

[73] Assignee: The United States of America as represented by the Administrator of the National Aeronautics and Space Administration, Washington, D.C.

[21] Appl. No.: 343,656

[22] Filed: Apr. 27, 1989

[51] Int. Cl.⁵ ............................................. H01L 41/08
[52] U.S. Cl. ................................... 310/339; 310/330; 310/331; 310/340
[58] Field of Search .............................. 310/330–332, 310/339, 340

[56] References Cited

U.S. PATENT DOCUMENTS

| | | | |
|---|---|---|---|
| 2,558,563 | 6/1951 | Janssen | 310/340 X |
| 3,113,223 | 12/1963 | Smith et al. | 310/329 |
| 3,350,583 | 10/1967 | Schiavone | 310/339 X |
| 3,363,139 | 1/1968 | Schiavone | 310/339 X |
| 3,457,463 | 7/1969 | Balamuth | 310/339 X |
| 3,539,841 | 11/1970 | Riff | 310/339 |
| 3,912,830 | 10/1975 | Murayama et al. | 310/800 X |
| 4,499,394 | 2/1985 | Koal | 310/340 X |
| 4,786,837 | 11/1988 | Kalnin et al. | 310/364 |

FOREIGN PATENT DOCUMENTS 0064179 4/1986 Japan ................................. 310/340

Primary Examiner—Mark O. Budd
Attorney, Agent, or Firm—William J. Sheehan; John R. Manning; Jerry L. Seemann

[57] ABSTRACT

A piezoelectrostatic generator includes a plurality of elongated piezoelectrostatic elements having first and second ends, with the first ends fixedly mounted in a cylindrical housing and the second extending radially inwardly toward an axis. A shaft movable along the axis is connected to the inner ends of the elements to produce bending forces in piezoelectric strips within the elements. Each element includes a pair of strips mounted in surface contact and in electrical series to produce a potential upon bending, Electrodes spaced from the strips by a solid dielectric material act as capacitor plates to collect the potential charges.

13 Claims, 4 Drawing Sheets

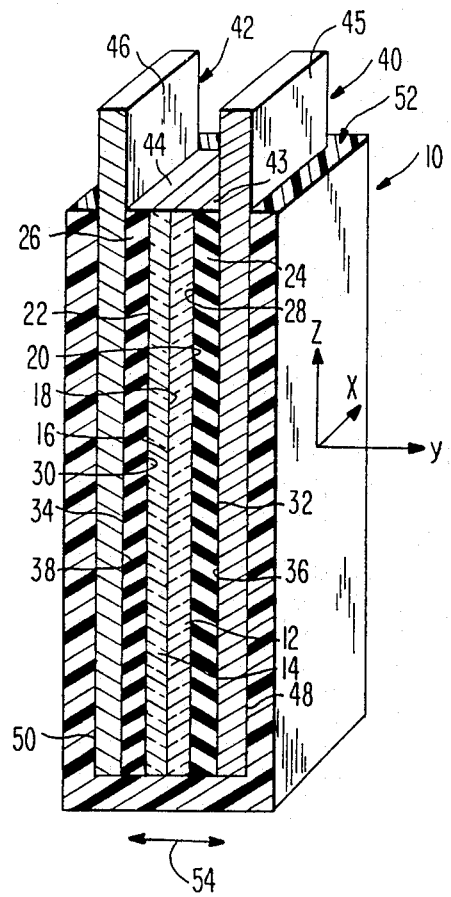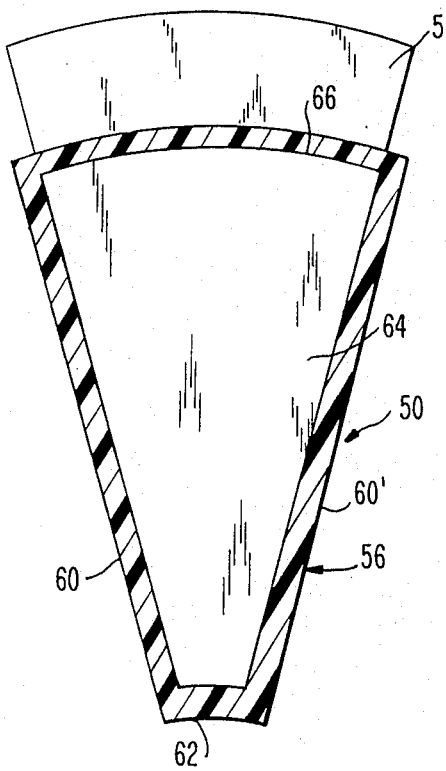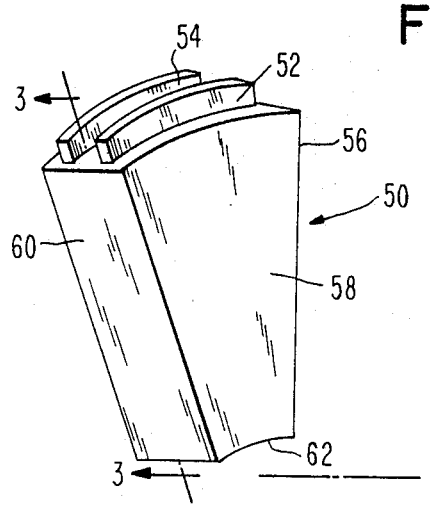
FIG. 1
FIG. 2
FIG. 3

PIEZOELECTROSTATIC GENERATOR

The invention described herein was made by an employee of the United States Government, and may be manufactured and used by or for the Government for Government purposes without the payment of any royalties thereon or therefor.

BACKGROUND OF THE INVENTION

The present invention relates, in general, to a piezoelectric generator wherein an internal electric potential is induced by the bending of strips of material exhibiting the piezoelectric effect, and more particularly to a plurality of such strips arranged radially about an axis to provide an annular stator for converting mechanical motion along the axis of the stator to corresponding electrical potentials.

There is a growing need for lightweight, compact power generators which are capable of producing high currents and high voltages for a variety of applications. For example, orbit transfer vehicles, space stations, and the like have a need for such generators which can produce power efficiently and reliably. Electrical or electromagnetic propulsion systems need power supplies which can produce high voltages at rapid pulse rates and at controllable frequencies.

The prior art has provided high power variable capacitance electrostatic generators, but such a device typically need an external power source to charge its rotor or stator electrodes, requires a vacuum to insulate the electrodes, and is only capable of generating a relatively low current. Thus, such devices are used only in the most extremely cases where high voltage potentials are more important than high current, or where the need for the generator overrides the cost of providing the vacuum.

SUMMARY OF THE INVENTION

It is an object of the present invention to provide an economical, pollution-free electrical power source which may be used for a wide variety of applications.

It is another object of the invention to provide a lightweight, high power electrostatic generator utilizing piezoelectric devices for producing high electrostatic voltages.

The present invention is directed to an electrostatic generator which utilizes strips of piezoelectric material which are connected to permit the use of a solid dielectric medium for the development of high electrical potentials without the need for expensive vacuum systems. The heart of the invention is the provision of a piezoelectrostatic element which is composed of two piezoelectric strips connected in series, two dielectric strips adjacent the piezoelectric strips, and two electrode strips mounted on the dielectric strips to form a stacked piezoelectrostatic element. All of the strips have the same surface dimensions, all are stacked adjacent to each other in surface-to-suface contact, and the entire stack is surrounded by an insulator. The piezoelectrostatic element is then mounted in a cantilevered fashion, with one end fixedly mounted, for example in a housing, and the other end extending outwardly therefrom to provide a free end which is movable to flex the piezoelectrostatic element in a bending mode. As a force is applied to the free end, bending of the piezoelectric strips causes polarization charges to appear over its now-curved surfaces, and these charges are induced onto the adjacent electrodes through the dielectric material The voltage on the electrodes produced in this manner is approximately equal to the voltage on the piezoelectric strips.

In a preferred form of the invention, numerous piezoelectrostatic elements are arranged radially about an axis, with the inner ends of the piezoelectrostatic elements being located at or adjacent the axis and the outer ends being fixedly mounted to a cylindrical frame which is coaxial with the elements. The radially inwardly extending piezoelectrostatic elements form a stator, with the annular arrangement of the elements facilitating the collection of the generated charges. Mechanical bending forces are applied to the piezoelectrostatic elements along the axis of the stator so as to bend all of the elements simultaneously. The stationary outer ends of the electrodes are connected to a load to receive AC power generated by the alternate bending of the piezoelectrostatic elements by application of a reciprocating force along the axis.

The maximum voltage potential across the electrodes of a piezoelectrostatic element is determined by the mechanical stress applied to the element. However, this voltage is limited by the breakdown voltage of the dielectric medium between the electrodes and the corresponding piezoelectric strips. Potentials in excess of 25,000 volts are easily obtainable, through presently known dielectrics.

The current output from the electrodes is directly proportional to the total surface area of the piezoelectric strips. This area can be increased by increasing the radial length of the elements in a stator or can be increased by mounting additional stators in parallel along the same axis. Such paralleling of the stators produces an increase in the current output without changing the voltage potential. Thus, the power output available from the stator or stators is proportional to the total surface area of all of the piezoelectric elements.

Maximum electrostatic power can be developed by short circuiting the electrodes during the bending of a stator from a zero deflection position to its maximum design deflection. Such short circuiting during bending produces a higher voltage across the electrodes than would be available if a load were connected during the bending process. This is due to the electrostatic effect brought on by the change in the dielectric constant of the piezoelectric strips during bending. When the piezoelectrostatic elements are bent from a zero deflection position to a maximum deflection position while its electrodes are short-circuited, charges freely migrate from one electrode to the other. This action puts the piezoelectric strips under no electrical stress and accordingly the strips will bend freely and their dielectric constant will be that of the unstressed strip. Under this condition, the voltage across the electrodes is approximately equal to that of the piezoelectric strips. When the strips reach their maximum deflection, the short-circuit connection is opened. Thereafter, the piezoelectrostatic elements are returned to their zero deflection position. The opening of the short circuit across the electrodes causes the charges on the electrodes to remain while the elements are deflected back to the zero position This places the piezoelectric strips under an electrical stress caused by the electrostatic force across the dielectric medium due to the charges on the electrodes. The piezoelectric strips resist the return to the zero deflection position, and this places a uniform mechanical stress on the strips which opposes the force on the free end of the cantilevered element which is driving the device back to its zero deflection position Under these conditions, the dielectric constant is the stressed dielectric constant which decreases proportionally with the distance from the maximum deflection position and which reaches a minimum at the zero deflection position. Under this mode of operation, the voltage across the electrodes rises as the piezoelectrostatic element approaches the zero deflection position.

DC power is obtained without using additional rectification circuits. This is accomplished by using numerous stators, and by applying a sinusoidal mechanical force to bend the individual stators to the same maximum voltage potential, but sequentially in time. If enough multiple stators are additively connected in this manner, the voltage output to a load will be constant, and no further rectification will be required.

The piezoelectrostatic generator constructed in accordance with the present invention can be made entirely of lightweight, non metallic materials, with the exception of the electrodes, so that the device is ideal for confined space and low weight applications.

BRIEF DESCRIPTION OF THE DRAWINGS

The foregoing, and additional objects, features and advantages of the present invention will become apparent to those of skill in the art from the following more detailed description taken in conjunction with the accompanying drawings, in which:

FIG. 1 is a perspective cross sectional view of a piezoelectrostatic element constructed in accordance with the present invention;

FIG. 2 is perspective view of a modified form of the piezoelectrostatic element of the present invention;

FIG. 3 is a cross-sectional view of the element of FIG. 2, taken along lines 3—3 thereof;

Figure 4:
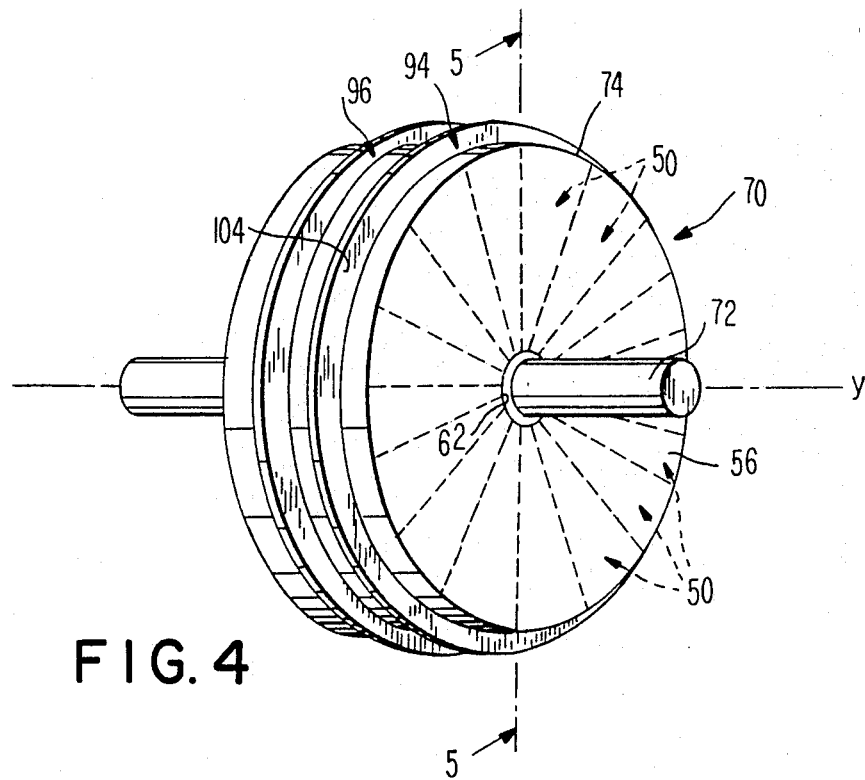
FIG. 4 is a perspective view of a piezoelectrostatic stator element in accordance with the present invention, utilizing the element of FIG. 2.

DESCRIPTION OF PREFERRED EMBODIMENTS:

With reference to the drawing, wherein common reference numerals refer to like components throughout the disclosure, FIG. 1 illustrates a piezoelectrostatic element 10 which incorporates first and second elongated, flat piezoelectric strips 12 and 14 each having oppositely polarized parallel surfaces. The strips are connected in electrical series with their adjacent surfaces 16 and 18 abutting each other in a common X-Z plane. The two piezoelectric strips have the same length and width in the X-Z plane, and thus have the same surface area, and have their thickness along a Y axis perpendicular to the X-Z plane. The piezoelectric strips may be of any known material exhibiting the piezoelectric effect, and thus each may be a single crystal such as quartz, lithium sulfate, zinc oxide, or the like, but preferably each is a ceramic material exhibiting the piezoelectric effect. Such piezoceramic materials as barium titanate, lead zirconate titanate and the like, are well known and suitable for use as the strip materials in the piezoelectrostatic element 10. Such materials respond to mechanical bending to produce electrical charges of opposite polarities on their opposite surfaces.

Adjacent the outer surfaces 20 and 22 of the piezoelectric strips 12 and 14, respectively, and in intimate contact therewith, are strips 24 and 26, respectively, of dielectric material. The dielectric material is coextensive with the surfaces 20 and 22 of the piezoelectric strips, and are of a thickness and material sufficient to withstand the electrostatic potentials generated by the piezoelectric strips 12 and 14. The inner surface 28 of dielectric strip 24 is in contact with the outer face 20 of piezoelectric element 12, with the common plane of these adjacent surfaces being parallel to the X-Z plane described above. Similarly, the inner surface 30 of dielectric layer 26 and the outer surface 22 of piezoelectric element 14 lie in a common plane which is parallel to the X-Z plane. The outer surfaces 32 and 34 of the dielectric layers are covered by, and are in contact with, the inner surfaces 36 and 38, respectively, of a pair of electrodes 40 and 42, the interfaces of these surfaces lying in planes parallel to the X-Z plane discussed above. The electrodes 40 and 42 are at least coextensive with the surfaces of the dielectric layers 24 and 26, respectively, and in addition preferably extend above the upper ends 43 and 44 of the dielectric layers to provide contact portions 45 and 46 for connection to external circuitry.

The outer surfaces 48 and 50 of the electrodes 40 and 42, respectively, as well as the ends of the strips 12 and 14 and the dielectric layers 24 and 26 are covered by an exterior insulating layer 52, which preferably is of the same material as the dielectric layers 24 and 26, but which may be any suitable electrically insulating material. The piezoelectrostatic element 10 is surrounded by the insulating material 52, with the upper ends of the electrode strips 40 and 42 extending out of the insulation as illustrated in FIG. 1. The piezoelectrostatic element 10 thus comprises a series of strips stacked in the Y-axis direction The electrodes are spaced from the piezoelectric strips by the dielectric material, and thus serve as capacitor plates to collect potential charges produced by the piezoelectric materials.

The element 10 is fixed at its upper end, as by being mounted in a suitable frame, so that it is mounted as a cantilever, with its lower end being free to move with respect to the upper end, and with a component of motion in the direction of the Y-axis, as illustrated by the arrow 54. Mechanical pressure may be applied to the lower end of the element 10 to deflect the piezoelectric strips 12 and 14 in a cantilevered bending mode in the Y-Z plane or having a component of motion in the Y-Z plane. The piezoelectric strips 12 and 14 are so polarized that upon deflection of the free end of the cantilevered element 10 along the Y-axis indicated by arrow 54, the bending of the strips will cause potential charges of different polarities to build up on the outer faces 20 and 22. Thus, the strip 12 may build up a positive charge on its face 20 when the element 10 is deflected in one direction, and when deflected in the opposite direction will build up a negative charge, while the opposite charges will appear on face 22 due to the bending of strip 14. These charges induce on the inner faces 36 and 38 of the electrode strips 40 and 42 charges of opposite polarities to the charges on the adjacent piezoelectric strips 12 and 14, respectively, and these electrode charges can be collected at contacts, such as the upper ends of the electrodes where the electrodes extend out of the element stack.

The element 10 of FIG. 1 is illustrated as being generally rectangular to provide a cantilever beam effect. However, the device may take on a variety of shapes, with an advantageous shape being illustrated in FIGS. 2. These figures illustrate a wedge-shaped piezoelectrostatic element 50 which is generally similar to the element of FIG. 1 in that it incorporates a pair of piezoelectric strips connected in series and covered by dielectric strips and corresponding electrodes, with the entire element being surrounded by an insulating layer. The element 50 in FIG. 2 is shown in perspective view and includes wedge-shaped electrodes 52 and 54 having contact portions extending out of the upper end of the piezoelectrostatic element. The element is surrounded by an insulating layer 56 which has a generally wedge-shaped front surface 58, a similarly shaped rear surface (not shown), a generally rectangular left end wall 60, and a similar right wall (not shown).

The element 50 may be mounted as a cantilever, in the manner described above with respect to FIG. 1, with its upper end fixedly mounted in a suitable frame, and with its lower, or free end 62 being movable to deflect the free ends of the piezoelectric strips to produce a bending mode in the cantilevered element.

FIG. 3 is a cross sectional view of FIG. 2 taken along line 3—3, showing the insulating layer 56 which surrounds the device, and illustrating a surface of one of the piezoelectric strips 64. As illustrated, the piezoelectric strip is wedge-shaped and extends substantially the entire width and length of the element 50 so as to produce the maximum surface area for collection of electrostatic charges. The electrodes 52 and 54 preferably are at least coextensive with the piezoelectric strip 64, and preferably extend above the upper edge 66 of the piezoelectric strip for connection to external circuitry, as illustrated.

Figure 5:
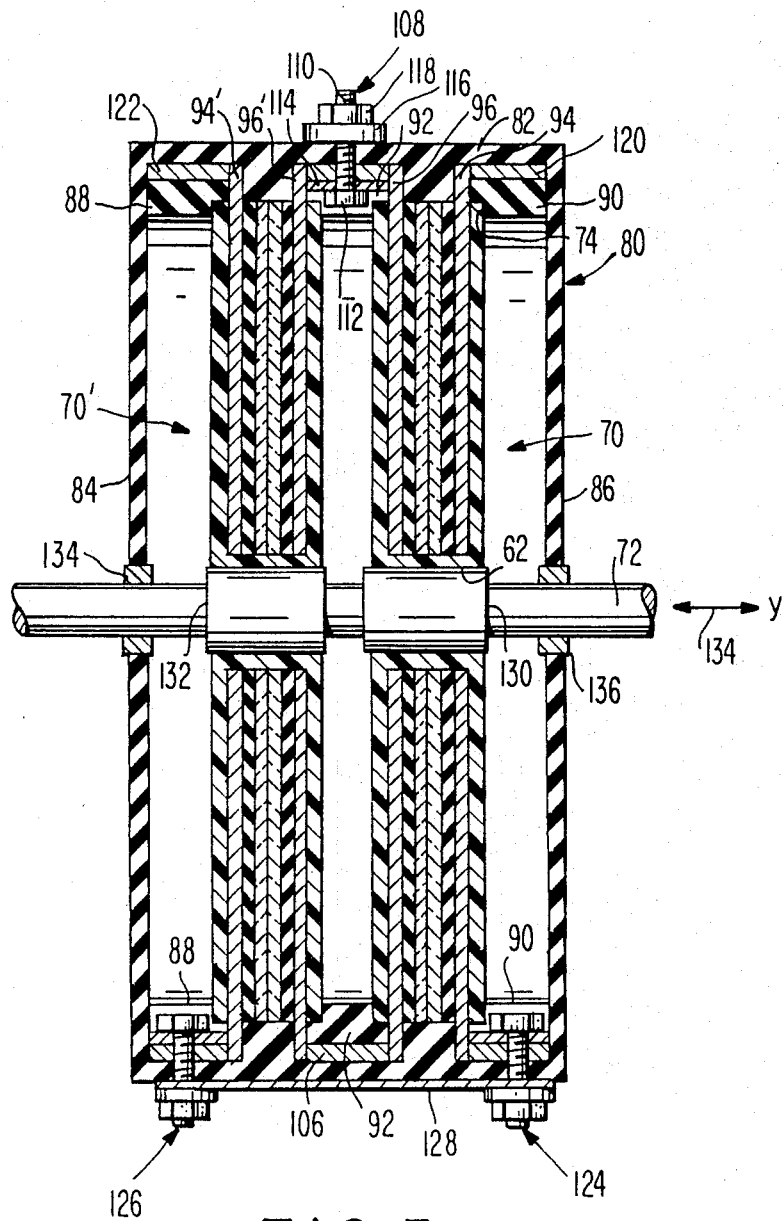
FIG. 5 is a cross-sectional view of a piezoelectrostatic generator utilizing two of the stators of FIG. 4.

In accordance with a preferred form of the invention, a plurality of the wedge-shaped piezoelectrostatic elements 50 are mounted in a suitable cylindrical frame to form an annular stator, generally indicated at 70 in FIGS. 4 and 5. The stator may be made up, for example, of 16 wedge-shaped elements 50, and extending radially outwardly from an axis 72 which may be connected to the free ends 62 of each of the elements. By clamping the outer rim 74 in a fixed frame or housing so that it remains stationary, the inner ends 62 of the several elements 50 may be moved along the Y-axis by means of common shaft 72.

As illustrated in FIG. 5, a plurality of stators 70 may be mounted on the common shaft 72, FIG. 5 illustrating stator 70 and a duplicate, second stator 70'. As there illustrated, the stators are secured at the outer rim 74 by means of a housing 80 which may be cylindrical in form and coaxial with the axis 72, the housing having a cylindrical side wall 82 and a pair of end walls 84 and 86. The side wall 82 is shaped to receive the stators 70 and 70', and includes spacer elements 88, 90 and 92 which engage the stator elements and secure them within the housing The spacer elements 88 and 90 extend between the end walls 84 and 86 and the outer surfaces of the stator elements 70' and 70, respectively, while the spacer element 92 lies between the two stators. The spacers are generally annular in shape, extending around the interior of the side wall 82 of the housing.

Figure 6:
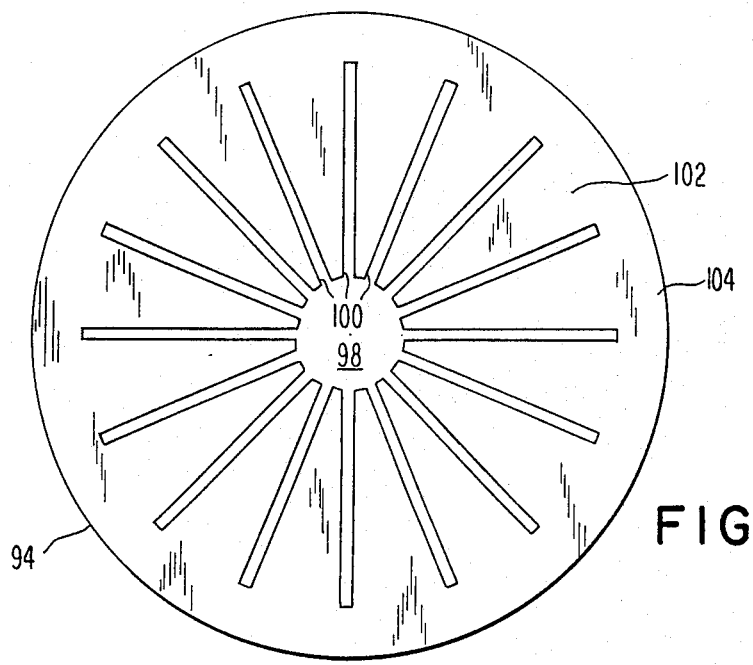
FIG. 6 is a plan view of an electrode used in the stator of FIG. 4.

Each stator incorporates a pair of continuous electrodes such as those illustrated in cross-section at 94 and 96 in FIG. 4. These electrodes are disc-shaped, as illustrated in the plan view of electrode 94 in FIG. 6. The electrode includes a central aperture 98 which accommodates the shaft 72 and includes a plurality of radial slots 100 which define the spacing between adjacent piezoelectrostatic elements 50. Thus, the wedge-shaped electrode segment 102 extending between adjacent slots 100 forms an electrode strip, such as the strip 40 or 42 in FIG. 1, which forms a part of a single piezoelectrostatic element. The peripheral surface 104 of the disc-shaped electrode extends between the outermost ends of the slots 100 and the outermost edge of the disc 94, and defines a continuous annular electrode contact portion which extends radially beyond the insulating layer 56. The insulating layer extends through the slots 100 to separate adjacent piezoelectrostatic elements. The stator includes two electrode discs such as that illustrated at 94 in FIG. 6, the annular contact portion of one disc serving to interconnect all of the electrode strips corresponding to electrode 52 (FIG. 2) and the annular contact portion of the other disc serving to interconnect all of the electrode strips corresponding to electrode 54 (FIG. 2). The discs 94 and 96 thus collect all of the electrostatic charges available on the individual wedge-shaped electrode strips so that those charges can be connected to external circuitry.

In order to facilitate collection of the potentials on the electrodes 94 and 96 from a plurality of stators, alternate stators may have their piezoelectric strips reversed in position so that the potentials they generate on the respective electrodes are of opposite polarities. Thus, for example, the bending of a piezoelectrostatic element by movement of shaft 72 to the right, as viewed in FIG. 5, might result in a positive potential appearing on the right-hand electrode 94 of stator 70, while the piezoelectric strips in the stator 70' would be reversed so that the same motion to the right would produce a positive potential on its left-hand electrode, identified as 94'. Such motion would simultaneously produce negative potentials on electrodes 96 and 96'. This facilitates interconnection of the electrodes from adjacent stators, in the manner illustrated in FIG. 5. As there shown, electrodes 96 and 96' in the two stators 70 and 70' are adjacent to each other and can be interconnected by means of an annular connector strip 106 which surrounds the spacer 92 and which extends around the inner surface of wall 82 of housing 80. The annular connector 106 serves to collect the similarly-poled potential from electrodes 96 and 96'. A terminal 108 extends through the connector 106 and through the side wall 82 of the housing to permit connection of the electrodes to an external load. The connector may consist of a bolt 110 having a head 112 in contact with the connector 106 through a washer 114, with an external washer 116 and a nut 118 on the bolt 110 holding the connector in place.

The two outer electrodes 94 and 94' are similarly connected to corresponding annular connector strips 120 and 122, respectively, the two outer strips being located on the inner surface of the housing wall 82 and in electrical contact with the respective electrodes 94 and 94'. The electrode connectors 120 and 122 are located radially outwardly of the spacers 90 and 88, respectively, and are attached to corresponding connectors 124 and 126, respectively. These connectors are similar in structure to the connector 108, and thus may be in the form of bolts extending through the respective connector strips 120 and 122 and secured in place by suitable washers and nuts. The connectors 124 and 126 are connected to each other by a connector 128 to provide an equal but opposite charge to that on connection 108, for connection to an external load.

Figure 7:
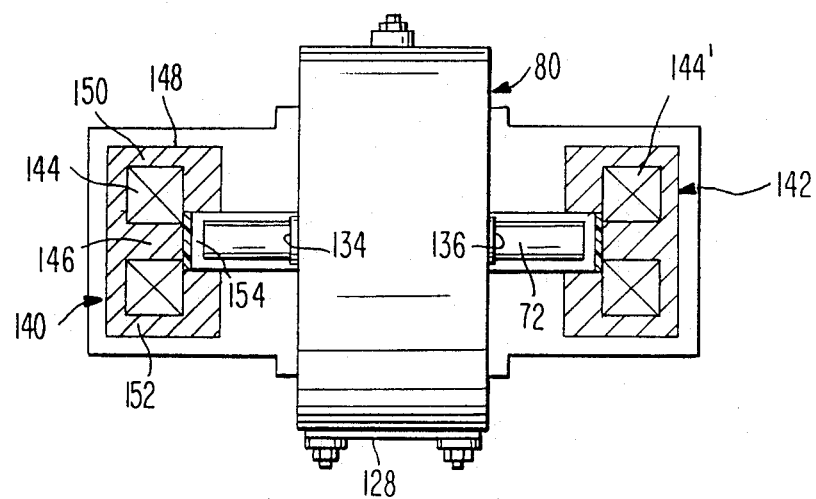
FIG. 7 is a partial sectional view of a piezoelectrostatic generator and drive motors therefor.

The housing 80 secures the peripheral edges of the stators so that the individual piezoelectrostatic elements extend radially inwardly as cantilevers toward the shaft 72. The innermost ends 62 of the elements are secured to the shaft 72, as by means of connectors 130 and 132. These connectors are mounted fixedly on shaft 72 and may be adhesively secured to the inner ends of the cantilevered piezoelectrostatic elements so that motion of the shaft 72 along the Y axis of the elements, as indicated by arrow 134 in FIG. 5, results in bending of the individual piezoelectrostatic elements and the consequent generation of electrostatic potentials on the corresponding electrodes, as described above. The rod 72 may be non metallic, and may be driven with a reciprocating motion along the Y axis. The shaft 72 passes through suitable bushings 134 and 136 mounted in the end plates 84 and 86, the bushings maintaining the rod axially centered in the end plates The shaft 72 may be moved in a reciprocating manner by any suitable drive motor such as, for example, the magnetic drivers 140 and 142 illustrated in FIG. 7. The magnetic drivers each include an electrical coil, such as that illustrated at 144, wound about the center leg 146 of a magnetic core 148. The outer legs 150 and 152 of the core extend around the exterior of the coil 144 and terminate near the end of the shaft 72, to define a gap 154 into which the end of the shaft 72 extends. If the shaft is of a nonmetallic material, then magnetic material must be mounted on the ends of the shaft to extend into the gap 154 so that the shaft will interact with the magnetic field produced by the coil 144. The driver 140 operates as a solenoid, with energization of the coil 144 serving to draw the shaft 72 into the gap 154. In similar manner, energization of the coil in driver 142 draws the shaft 72 into its gap, and alternate energization of the drivers causes the shaft 72 to reciprocate along its axis.

Figure 8:
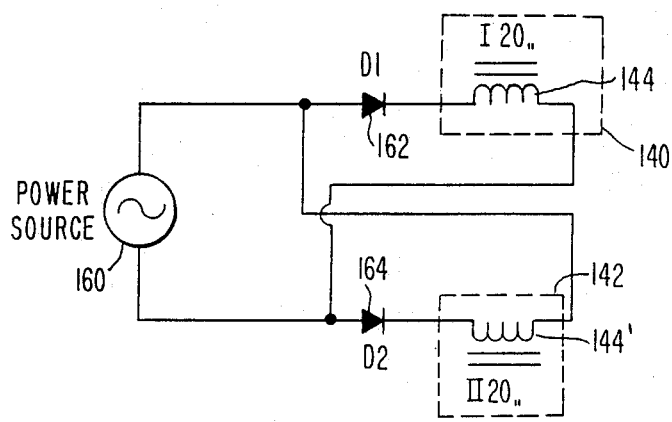
FIG. 8 is a schematic diagram of the drive motors for the generator of FIG. 7.

As illustrated in FIG. 8, the electrical coils of the two drivers 140 and 142 are connected to a power source 160, which may be a source of sinusoidal alternating current. This current produces in the drivers 140 and 142 sinusoidal magnetic forces which are applied to the oposite ends of shaft 72. Switching of the magnetic force on the shaft from one direction to the other is accomplished by placing diodes 162 and 164 in series with the power source and the respective drivers 140 and 140', as illustrated in FIG. 8.

Figure 9:
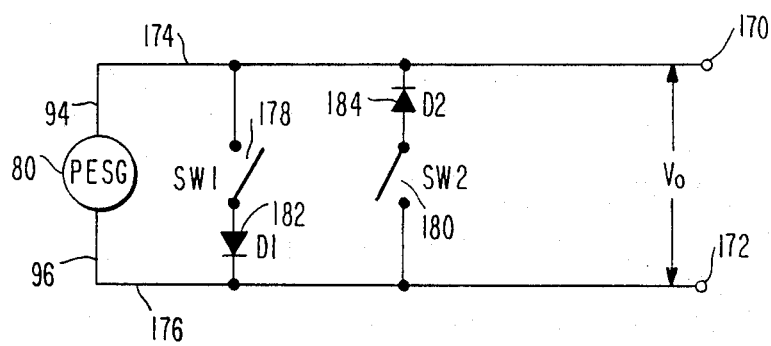
FIG. 9 is a schematic diagram of a generator circuit for producing DC voltages.

FIG. 9 is a schematic illustration of the use of a piezoelectrostatic device 80 for production of a voltage $V_0$ across a pair of output terminals 170 and 172. The electrodes 94, 94' from the device 80 are connected by way of line 174 to terminal 170, while the electrodes 96, 96' from device 80 are connected by way of line 176 to terminal 172. Connected across lines 174 and 176 are a pair of switches 178 and 180, with the switch 178 being connected in series with a diode 182 and the switch 180 being connected in series with a diode 184. The diodes are oppositely poled and the two switches are connected and operated so that when the voltage on the electrodes is at zero, one switch, for example switch 178, is closed and the other, for example switch 180, is open. At maximum positive voltage, the closed switch 178 is opened. When the voltage on the electrodes is again at zero, the other switch 180 is closed until maximum negative voltage is reached, at which time the switch 180 is opened. The two diodes 182 and 184 are connected so that the charge buildup on either side of the electrodes cannot migrate in the wrong direction. This connection and operation of the switches allows a maximum voltage to build on the terminals 170 and 172.

From the foregoing, it will be seen that a method and apparatus has been provided for generating electrical power through the use of the electrostatic charges produced on electrodes spaced from piezoelectric strips by dielectric spacers, wherein the piezoelectric strips are mounted in a cantilevered manner and are bent by a force applied to the unfixed end. The apparatus is particularly adaptable for use as a means for generating electrical energy of high voltage The device is of simple construction, eliminating the need for heavy electrical coils or other massive moving parts, thereby providing a large savings in both initial cost and maintenance. The direct production of power from electrostatic potentials provides a high efficiency so that greater electrical energies are obtainable with apparatus occupying a small space and being light in weight. Although the present invention has been illustrated in terms of preferred embodiments, it will be apparent that variations and modifications may be made without departing from the true spirit and scope thereof, as set forth in the following claims.

What is claimed is:

1. A piezoelectrostatic element, comprising:
    first and second flat, elongated strips of piezoelectric material, each of said strips having first and second ends and first and second parallel planar surfaces, each said strip producing an electrical potential across its first and second surfaces in response to mechanical bending thereof, said strips being mounted in intimate surface-to-surface contact in a common plane and in electrical series to produce, upon bending, an electrical potential across the noncontacting surfaces of the mounted strips;
    first and second elongated layers of dielectric material mounted on and being coextensive with, the noncontacting surfaces of said piezoelectric strips, respectively;
    first and second elongated electrode strips mounted on, and being at least coextensive with, said first and second dielectric layers, respectively, said electrode strips being parallel to said piezoelectric strip surfaces and spaced from said piezoelectric strips by said dielectric layers; and
    an insulating layer surrounding said piezoelectric strips, dielectric layers and electrode strips to form a piezoelectrostatic element;
    means fixedly mounting said element at one end, the other end thereof being movable with respect thereto to bend said piezoelectric strips to produce said electrical potential, said potential appearing across said electrode strips; and
    means connected to said relatively movable end for driving said movable end to produce a component of motion along an axis perpendicular to said common plane.

2. The element of claim 1, wherein said electrode strips include electrical contact portions extending out of said insulating layer 3. The element of claim 2, wherein said piezoelectric strips are wedge-shaped to taper inwardly from said fixed end to said relatively movable end.

4. The element of claim 1, wherein said means mounting said element comprises a cylindrical housing coaxial with said axis, said element extending radially from said housing toward said axis.

5. The element of claim 4, wherein said means for driving said movable end comprises shaft means connected to said relatively movable end.

6. The element of claim 5, wherein said means for driving further includes motor means.

7. A piezoelectrostatic generator, comprising:
a housing;
a plurality of elongated piezoelectrostatic elements each having first and second ends, each said element having its first end fixedly mounted to said housing and its second end relatively movable to produce a bending motion in said element to thereby form a stator, each of said piezoelectrostatic elements comprising a pair of first and second elongated strips of piezoelectrostatic material, each said strip having first and second parallel planar surfaces, each said strip producing an electrical potential across its first and second surfaces in response to mechanical bending thereof, said first and second strips being mounted to place corresponding surfaces in intimate surface-to-surface contact in a common plate and in electrical series to produce, upon bending, an electrical potential across the noncontacting surfaces of the mounted strips;
first and second elongated layers of dielectric material mounted on and being coextensive with, the noncontacting surfaces of said piezoelectric strips, respectively;
first and second elongated electrode strips mounted on, and being at least coextensive with, said first and second dielectric layers, respectively, said electrode strips being parallel to said piezoelectric strip surfaces and spaced from said piezoelectric strips by said dielectric layers;
drive means connected to said relatively movable ends of said elements to produce a component of motion in each element along an axis perpendicular to said common plane of said element; and
electrical contact means connected to said first and second electrodes of each said element for collecting the electric potential produced by bending said piezoelectrostatic 8. The generator of claim 7, wherein said housing is cylindrical and has a central axis, and wherein said elements are fixedly mounted at the periphery thereof and extend inwardly toward said axis.

9. The generator of claim 7, wherein said plurality of elements extend around said housing to form an annular stator, and wherein said drive means is coaxial with said housing and is connected to the relatively movable ends of said elements to produce a component of motion in each element along said housing axis.

10. The generator of claim 9, further including a second plurality of elongated piezoelectrostatic elements substantially identical to said first-mentioned plurality of piezoelectrostatic elements to form a second stator, said first and second stators being mounted side-by-side in said housing.

11. The generator of claim 10, wherein said drive means is connected to said first and second stators.

12. The generator of claim 11, wherein said drive means includes motor means for reciprocally driving said elements along said housing axis.

13. The generator of claim 12, further including connector means for electrically interconnecting selected electrode strips of said piezoelectrostatic elements.

* * * * *